United States Patent [19]

Takahashi et al.

[11] Patent Number: 5,162,895

[45] Date of Patent: Nov. 10, 1992

[54] LEAD FRAME FOR SEMICONDUCTOR DEVICE THAT PREVENTS ISLAND TORSION

[75] Inventors: Kenji Takahashi, Ooita; Junichi Asada; Kazunori Hayashi, both of Yokohama, all of Japan

[73] Assignee: Kabushiki Kaisha Toshiba, Kawasaki, Japan

[21] Appl. No.: 685,920

[22] Filed: Apr. 16, 1991

[30] Foreign Application Priority Data

Apr. 18, 1990 [JP] Japan ................................. 2-102135

[51] Int. Cl.⁵ .............................................. H01L 23/48
[52] U.S. Cl. ..................................... 257/670; 257/676
[58] Field of Search ................................. 357/70, 68

[56] References Cited

U.S. PATENT DOCUMENTS

| | | | |
|---|---|---|---|
| 4,482,915 | 11/1984 | Nishikawa et al. | 357/70 |
| 4,706,105 | 11/1987 | Masuda et al. | 357/70 |
| 4,801,997 | 1/1989 | Ono et al. | 357/70 |
| 4,942,454 | 7/1990 | Mori et al. | 357/72 |

FOREIGN PATENT DOCUMENTS

| | | | |
|---|---|---|---|
| 54-55169 | 2/1979 | Japan | 357/70 |
| 56-91455 | 7/1981 | Japan | 357/70 |
| 61-23351 | 1/1986 | Japan | 357/70 |
| 62-136056 | 1/1987 | Japan | 357/70 |
| 63-110763 | 5/1988 | Japan | 357/70 |
| 63-181362 | 7/1988 | Japan | 357/70 |
| 1-304759 | 12/1989 | Japan | 357/70 |
| 2-244750 | 9/1990 | Japan | 357/70 |

*Primary Examiner*—Rolf Hille
*Assistant Examiner*—S. V. Clark
*Attorney, Agent, or Firm*—Foley & Lardner

[57] ABSTRACT

A lead frame for a semiconductor device having: first and second frame portions facing each other and spaced apart by a predetermined distance; an island (4) formed at a position sandwiched between the first and second frame portions for mounting a semiconductor chip; a pair of tie bars for integrally coupling the first frame portion and a side of the island facing the first frame portion, the pair of tie bars being formed with a predetermined space in the widthwise direction; and a pair of tie bars for integrally coupling the second frame portion and a side of the island facing the first frame portion, the pair of tie bars being formed with a predetermined space in the widthwise direction.

6 Claims, 4 Drawing Sheets

PRIOR ART

*PRIOR ART*

LEAD FRAME FOR SEMICONDUCTOR DEVICE THAT PREVENTS ISLAND TORSION

FIELD OF THE INVENTION

The present invention relates to a lead frame for a semiconductor device.

BACKGROUND OF THE INVENTION

FIGS. 1 and 2 are partial plan views of lead frames used as a component of a semiconductor device of a dual-in-line package (DIP) type or a small-out line J-Leaded package (SOJ) type. In FIGS. 1 and 2, inner leads are omitted.

Referring to FIG. 1, island supports extend inside of a pair of opposing frame portions 1, 1 and support an island 4. A semiconductor chip 5 is mounted on the island 4. In this condition, the chip 5 and inner leads are bonded together. Thereafter, all of the chip 5, island 4, inner leads, and inner portions of the island support 3, 3 are molded together using mold compound or resin 7.

FIG. 2 shows a different type of tie bars. In each tie bar 3, two support pieces 3A, 3A extend from a frame 1 and join together to form one support piece 3B which is integrally coupled to an island 4.

As seen from FIG. 3, molding is performed in the following manner. The chip 5, island 4 and the like subjected to bonding are held in position using a mold. This mold has a resin injection port 9 (gate) and a cavity 10 communicating with the port 9. Molding resin in a melted state is injected within the cavity. FIG. 4 shows the state where the resin 7 has been injected partially within the cavity 10. Thereafter, the resin 7 is injected into the whole area within the cavity 10 to complete resin molding.

As the resin 7 is injected from the gate 9 as shown in FIG. 3, the resin 7 hits the end surfaces of the island 4 and chip 5 so that they are sometimes twisted about the island supports 3. As the chip 5 and the island 4 become large in size, the amount of resin to be injected becomes large and the injection speed becomes high. Therefore, as the chip 5 and the like become large in size, the above problem of twist or torsion becomes significant. FIG. 4 is a schematic diagram corresponding to the view taken along line VII—VII of FIG. 3, wherein there is shown an example of a semiconductor device whose chip 5 and island 6 are twisted by an angle $\theta$ about the island supports 3, 3. As seen from FIG. 4, if the chip 5 and the island 4 are twisted, the stress distribution within the cured resin 7 becomes uneven. In a worst case, a crack 11 is formed. Reference numeral 12 in FIG. 4 represents leads.

SUMMARY OF THE INVENTION

The present invention has been made in consideration of the above circumstances. It is an object of the present invention to provide a lead frame for a semiconductor device which frame is free from torsional motion about island supports of an island mounting a chip, particularly at a molding process of semiconductor manufacturing processes.

According to one aspect of the present invention, a lead frame for a semiconductor device having: first and second frame portions facing each other and spaced apart by a predetermined distance; an island formed at a position sandwiched between the first and second frame portions for mounting a semiconductor chip; a pair of island support for integrally coupling the first frame portion and a side of the island facing the first frame portion, the pair of island supports being formed spaced apart by a predetermined distance in the widthwise direction; and a pair of island supports for integrally coupling the second frame portion and a side of the island facing the first frame portion, the pair of island supports being formed spaced apart by a predetermined distance in the widthwise direction.

DESCRIPTION OF THE PREFERRED EMBODIMENTS

Figure 5:
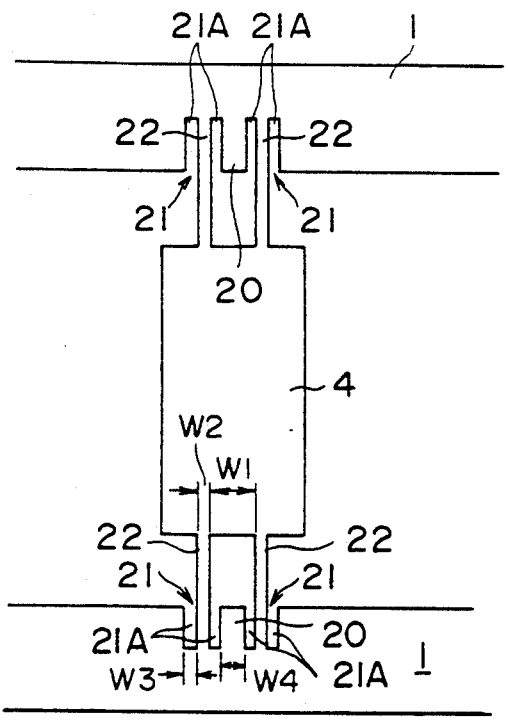
FIGS. 5 to 7 are partial plan views of first to third embodiments of the lead frame according to the present invention.

FIG. 5 is a plan view showing the main part of a lead frame according to an embodiment of this invention. At the area inside of the inner edge of each frame portion 1, there are formed two trenches 21 and 21 sandwiching a guide plate 20. A pair of island supports extends from the bottom of the trench 21 into the inside space of the frame. The island supports 22, 22 support the shorter side of an island 4. The top end surface of the guide plate 20 is aligned with a mold line to thereby prevent a leak of incoming resin. The distance W1 between two island supports 22 and 22 is determined when designing inner leads. It is however preferable that the distance W1 between two island supports 22 and 22 is set to at least twice the width W2 of the 22, in order to prevent torsion (rotation) of the island 4. It is preferable that the width W3 of each of slits 21A and 21A on opposite sides of each island support is set to substantially the same width W2 of the island support 22. It is preferable that the width W4 of the tongue plate (guide plate) 20 is set to substantially the same width as, or three times as wide as, the width W2 of the island support 22. It is not necessarily required that the two island supports 22 and 22 are in parallel, unless they intersect with each other. For example, the trench width W3 is set to 0.2 to 0.6 mm, and the distance W2 between trenches (corresponding to the width of the island support 22) is set to 0.2 to 0.6 mm.

Figure 6:
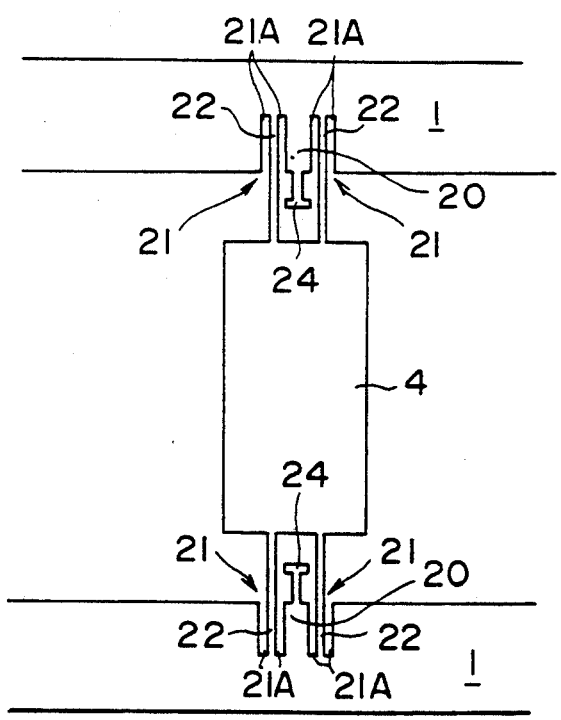

FIG. 6 shows the second embodiment wherein a protrusion 24 is formed extending from the tip of the tongue plate 20 shown in FIG. 5. This protrusion 24 effectively prevents the tongue plate 20 from being deformed during molding.

Figure 7:
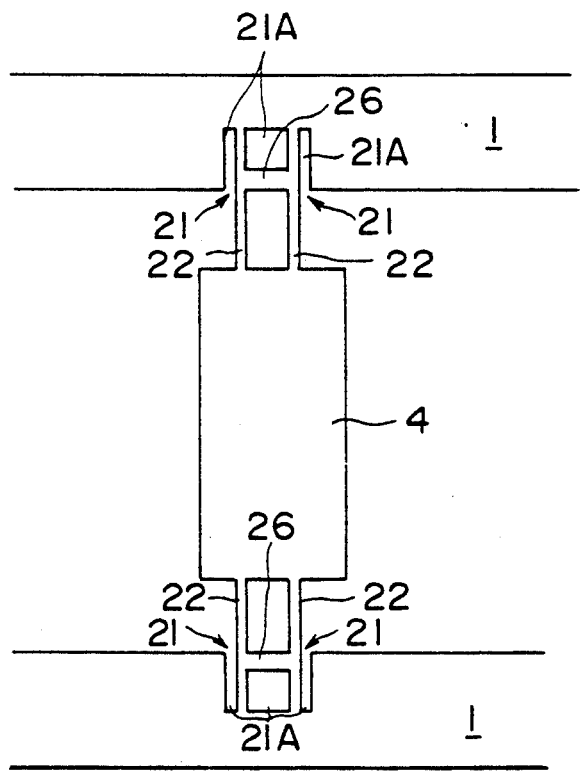

FIG. 7 shows the third embodiment of this invention wherein two tie bars 22 and 22 are coupled by a bridge 26. This bridge 26 more effectively suppresses the rotation of the island during molding.

The following advantageous effects can be obtained by the embodiments of this invention. Since slits are formed on both sides of the island support, the island support can be elongated without making the frame large. With such an elongated tie bar, the rigidity or the tie bar becomes low. Therefore, it is possible to provide a proper semiconductor device while preventing warpage during island bonding, deformation of the frame held during wire bonding, and the like. Furthermore, the tongue plate is formed between a pair of island supports, and a protrusion is formed on the tongue plate, the protrusion being molded within the molding resin. Therefore, the tongue plate operates as a cantilever, thereby preventing deformation like peel-off of the tongue plate during shape forming and burr removing, and preventing transport mistakes during lead forming.

Figure 1:
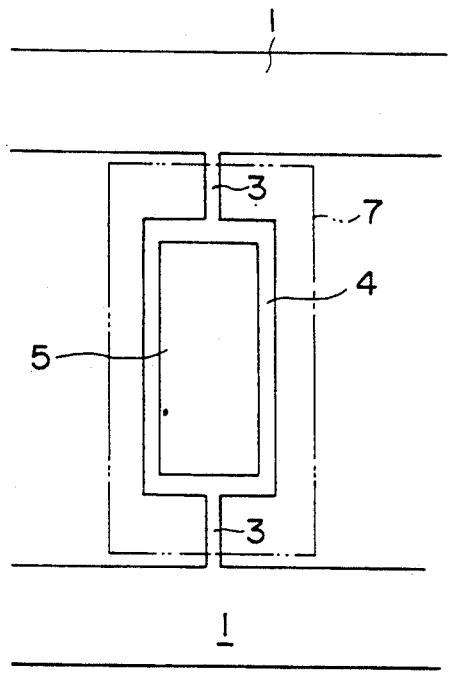
FIGS. 1 and 2 are partial plan views of different lead frames according to a conventional technique.
Figure 2:
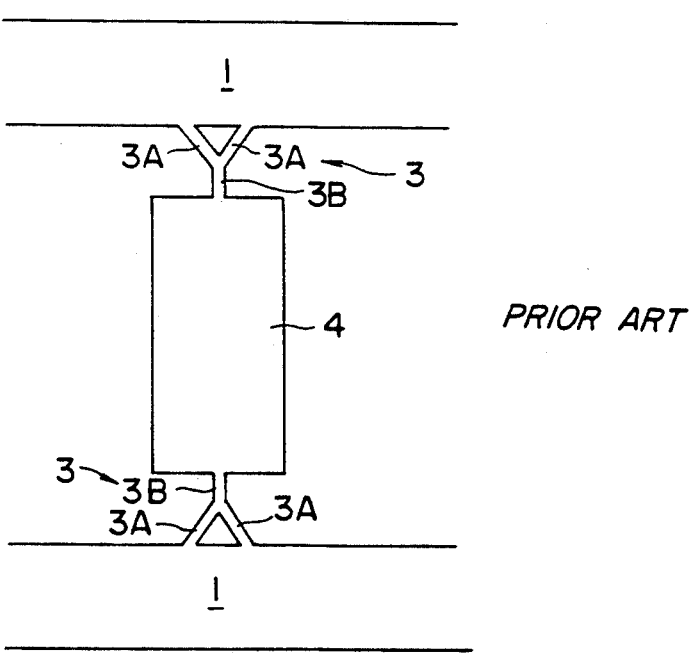
Figure 3:
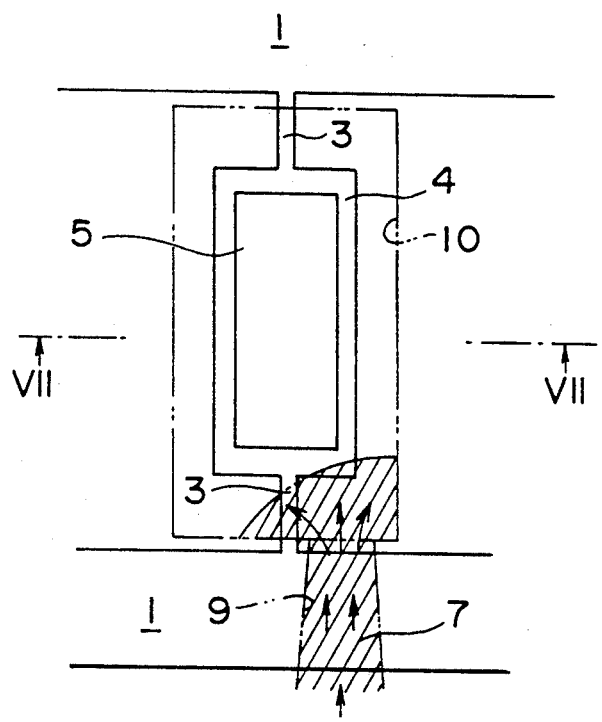
FIG. 3 is a view illustrating the state that resin is being injected to form a molded device.
Figure 4:
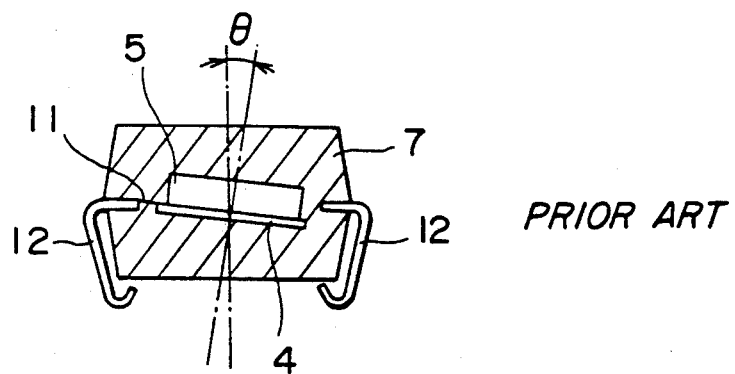
FIG. 4 is a view illustrating a torsion or twist of an island and a chip.

Next, the experiment results obtained for confirming the advantages of the embodiment of this invention will be described. Table 1 shows a comparison between the embodiment of this invention shown in FIG. 6 and a conventional frame shown in FIG. 1, with respect to the torsion angle $\theta$ (refer to FIG. 4) during molding.

TABLE 1

|  | Present Invention | Conventional |
|---|---|---|
| Angle $\theta$ | 0.13° | 2.8° |

As seen from Table 1, the embodiment of this invention can make the torsion angle $\theta$ considerably small.

Table 2 shows the numbers of frames which had a crack (refer to FIG. 4 at reference numeral 11) relative to the total numbers of frames, when the above two types of frames are tested by mounting them on a substrate. In this test, each package was exposed to 85° C./85% RH, and dipped within Florinate (product name) for 2 minutes until the moisture amount (absorbed moisture amount) becomes saturated. The frames, twenty frames in total, manufactured according to the embodiment of this invention all had no crack formed. In contrast, of twenty frames manufactured as conventional, eleven frames had cracks. It is also seen from Table 2 that the embodiments of this invention can suppress generation of cracking.

TABLE 2

|  | Present Invention | Conventional |
|---|---|---|
| Crack Generation Ratio | 0/20 | 11/20 |

What is claimed is:

1. A lead frame for a semiconductor device comprising:
    first and second frame portions facing each other and spaced apart by a predetermined distance;
    an island formed at a position sandwiched between said first and second frame portions for mounting a semiconductor chip;
    a pair of island supports for integrally coupling said first frame portion and a side of said island facing said first frame portion, said pair of island supports being formed with a predetermined space therebetween in the widthwise direction;
    a pair of island supports for integrally coupling said second frame portion and a side of said island facing said first frame portion, said pair of island supports being formed with a predetermined space therebetween in the widthwise direction;
    trenches formed in an area inside of an inner edge of said first frame portion and trenches formed in an area inside of an inner edge of said second frame portion, said island support extending from the bottom of each of said trenches toward said island; and
    slits formed on both sides of each of said island supports.

2. A lead frame according to claim 1, wherein said first and second frame portions each have a tongue piece said tongue piece being formed between said pair of island supports formed with a predetermined space, and said each of tongue pieces extending toward said island.

3. A lead frame according to claim 1, wherein said first and second frame portions each have a tongue piece, said tongue piece 20 being formed between said pair of island supports formed with a predetermined space, and said each of tongue pieces extending toward said island.

4. A lead frame according to claim 2, wherein said tongue piece is formed with a protrusion piece extending toward said island, said protrusion piece being molded within a molding resin to be prevented from deformation of said tongue piece.

5. A lead frame according to claim 3, wherein said tongue piece is formed with a protrusion piece extending toward said island, said protrusion piece being molded within a molding resin to be prevented from deformation of said tongue piece.

6. A lead frame according to claim 1 wherein a trench is formed at the area inside of the inner edge of said first frame portion, a trench is formed at the area inside of the inner edge of said second frame portion, said pair of tie bars extends from the bottom of each of said trench toward said island, and said pair of island support are coupled together by a lateral bridge.

* * * * *